(12) United States Patent
Chan et al.

(10) Patent No.: US 8,829,687 B2
(45) Date of Patent: Sep. 9, 2014

(54) SEMICONDUCTOR PACKAGE AND FABRICATION METHOD THEREOF

(71) Applicant: Siliconware Precision Industries Co., Ltd., Taichung (TW)

(72) Inventors: Mu-Hsuan Chan, Taichung Hsien (TW); Wan-Ting Chen, Taichung (TW); Yi-Chian Liao, Taichung Hsien (TW); Chun-Tang Lin, Taichung Hsien (TW); Yi-Chi Lai, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/722,138

(22) Filed: Dec. 20, 2012

(65) Prior Publication Data

US 2014/0084455 A1 Mar. 27, 2014

(30) Foreign Application Priority Data

Sep. 26, 2012 (TW) .............................. 101135245 A

(51) Int. Cl.
*H01L 23/48* (2006.01)
*H01L 21/00* (2006.01)
*H01L 21/78* (2006.01)
*H01L 23/00* (2006.01)
*H01L 23/498* (2006.01)

(52) U.S. Cl.
CPC .......... *H01L 23/49811* (2013.01); *H01L 21/78* (2013.01); *H01L 24/96* (2013.01); *H01L 24/19* (2013.01); *H01L 2224/04105* (2013.01)
USPC ........... 257/777; 257/621; 257/737; 257/773; 257/775; 257/783; 257/E23.021; 257/E23.069; 257/E23.174; 438/109; 438/127; 438/612

(58) Field of Classification Search
USPC .................. 257/621, 737, 738, 778, E23.021, 257/E23.069, 774, 693, 773, 777, 783, 257/E23.174; 438/106, 108, 109, 127, 438/612–617
See application file for complete search history.

(56) References Cited

U.S. PATENT DOCUMENTS 6,429,509 B1 * 8/2002 Hsuan ............................ 257/690
2011/0095439 A1 * 4/2011 Chin ............................ 257/774

\* cited by examiner

*Primary Examiner* — Jasmine Clark
(74) *Attorney, Agent, or Firm* — Edwards Wildman Palmer LLP; Peter F. Corless; Steven M. Jensen

(57) ABSTRACT

A semiconductor package is provided, which includes: a semiconductor substrate having opposite first and second surfaces; an adhesive layer formed on the first surface of the semiconductor substrate; at least a semiconductor chip disposed on the adhesive layer; an encapsulant formed on the adhesive layer for encapsulating the semiconductor chip; and a plurality of conductive posts penetrating the first and second surfaces of the semiconductor substrate and the adhesive layer and electrically connected to the semiconductor chip, thereby effectively reducing the fabrication cost, shortening the fabrication time and improving the product reliability.

18 Claims, 3 Drawing Sheets

SEMICONDUCTOR PACKAGE AND FABRICATION METHOD THEREOF

CROSS-REFERENCE TO RELATED APPLICATIONS

This application claims the benefit of Taiwanese Application 101135245 filed on Sep. 26, 2012, the entire contents of which is incorporated herein by reference.

BACKGROUND OF THE INVENTION

1. Field of the Invention

The present invention relates to semiconductor packages and fabrication methods thereof, and more particularly, to a flip-chip semiconductor package and a fabrication method thereof.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a packaging substrate adversely affects the formation of joints between conductive bumps of the chip and contacts of the packaging substrate, thus easily resulting in delamination of the conductive bumps from the packaging substrate.

On the other hand, along with increased integration of integrated circuits, a CTE mismatch between a chip and a packaging substrate induces more thermal stresses and leads to more serious warpage, thereby reducing the product reliability and resulting in failure of a reliability test.

To overcome the above-described drawbacks, a silicon interposer is disposed between a semiconductor chip and a packaging substrate. Referring to FIG. 1A, a plurality of TSVs 111 are formed in a silicon wafer 10. A redistribution layer 12 is formed on an upper side of the wafer and a plurality of solder balls 13 are formed on a lower side of the wafer. Then, a singulation process is performed to obtain a plurality of silicon interposers 11. Subsequently, a semiconductor chip 14 is disposed on the redistribution layer 12 of a silicon interposer 11 and an underfill 15 is formed between the semiconductor chip 14 and the silicon interposer 11. Then, the silicon interposer 11 is disposed on a substrate 16 and an underfill 17 is formed between the silicon interposer 11 and the substrate 16. As such, a semiconductor package is formed. Since the silicon interposer and the semiconductor chip are made of similar materials, the above-described drawbacks caused by a CTE mismatch can be effectively prevented.

However, the silicon interposer 11 is required to have a plurality of bumps 18 pre-formed thereon so as for the semiconductor chip 14 to be disposed on the silicon interposer 11 through the bumps 18. As such, the bumps 18 between the silicon interposer 11 and the semiconductor chip 14 can be easily affected by temperature variation during the fabrication process, thus easily resulting in cracking at joint interfaces and consequently reducing the product reliability.

FIG. 1B shows a partially enlarged view of FIG. 1A. Referring to FIG. 1B, an UBM (Under Bump Metallurgy) layer 142, a metal post 143 and a nickel layer 144 are sequentially formed on electrode pads 141 of the semiconductor chip 14 and then the nickel layer 144 is bonded to the bumps 18 of the silicon interposer 11 so as to bond the semiconductor chip 14 to the silicon interposer 11. Alternatively, the nickel layer 144 is formed on the bumps 18 and a reflow process is performed to bond the semiconductor chip 14 to the silicon interposer 11. As such, multiple joint interfaces are formed between each of the electrode pads 141 and the corresponding bump 18 of the silicon interposer 11. Since cracking can easily occur at the multiple joint interfaces due to thermal stresses, the product reliability is reduced.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a semiconductor substrate having opposite first and second surfaces; an adhesive layer formed on the first surface of the semiconductor substrate; at least a semiconductor chip disposed on the adhesive layer; an encapsulant formed on the adhesive layer for encapsulating the semiconductor chip; and a plurality of conductive posts penetrating the first and second surfaces of the semiconductor substrate and the adhesive layer and electrically connected to the semiconductor chip.

In the above-described package, the semiconductor substrate, the adhesive layer and the encapsulant can be flush with one another at sides. A redistribution layer can be formed on the second surface of the semiconductor substrate.

The semiconductor chip can have a redistribution layer formed thereon and electrically connected to the conductive posts.

The package can further comprise a plurality of conductive elements formed on one ends of the conductive posts.

The conductive posts can be formed by electroplating, and can be in direct contact with the semiconductor chip.

The present invention further provides a fabrication method of a semiconductor package, which comprises the steps of: providing a semiconductor substrate having a first surface with an adhesive layer and a second surface opposite to the first surface; disposing at least a semiconductor chip on the adhesive layer of the first surface of the semiconductor substrate; forming an encapsulant on the adhesive layer for encapsulating the semiconductor chip; and forming a plurality of conductive posts penetrating the first and second surfaces and the adhesive layer and electrically connected to the semiconductor chip.

Before forming the conductive posts, the above-described method can further comprise removing a portion of the semiconductor substrate from the second surface thereof. After forming the conductive posts, the method can further comprise performing a singulation process.

After forming the conductive posts, the method can further comprise forming a redistribution layer on the second surface of the semiconductor substrate. After forming the redistribution layer, the method can further comprise performing a singulation process.

The semiconductor substrate, the adhesive layer and the encapsulant can be flush with one another at sides.

The semiconductor chip can further have a redistribution layer formed thereon and electrically connected to the conductive posts.

In the above-described method, forming the conductive posts can further comprise the steps of: forming a plurality of through holes penetrating the semiconductor substrate and the adhesive layer; and forming the conductive posts in the through holes by electroplating.

The above-described method can further comprise forming a plurality of conductive elements on one ends of the conductive posts. The conductive posts can be in direct contact with the semiconductor chip.

Therefore, by electrically connecting the semiconductor chip and the semiconductor substrate through the conductive posts instead of the conventional bumps, the present invention reduces the fabrication cost. Further, the present invention reduces the number of joint interfaces between the electrode pads of the semiconductor chip and the conductive posts of the semiconductor substrate, thereby preventing cracking from occurring at joint interfaces and improving the product reliability. Furthermore, the present invention dispenses with an underfilling process by directly attaching the semiconductor chip to the adhesive layer, thereby shortening the fabrication time and improving the product reliability. In addition, the encapsulant is formed to protect the semiconductor chip against external environment and increase the rigidity of the overall structure so as to prevent the structure from being damaged during the fabrication process.

BRIEF DESCRIPTION OF DRAWINGS

FIGS. 1A and 1B are schematic cross-sectional views showing a conventional semiconductor package, wherein FIG. 1B is a partially enlarged view of FIG. 1A.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "first", "second", "upper", "lower", "a" etc. are merely for illustrative purpose and should not be construed to limit the scope of the present invention.

FIGS. 2A to 2H are schematic cross-sectional views showing a semiconductor package and a fabrication method thereof according to the present invention.

Figure 1A:
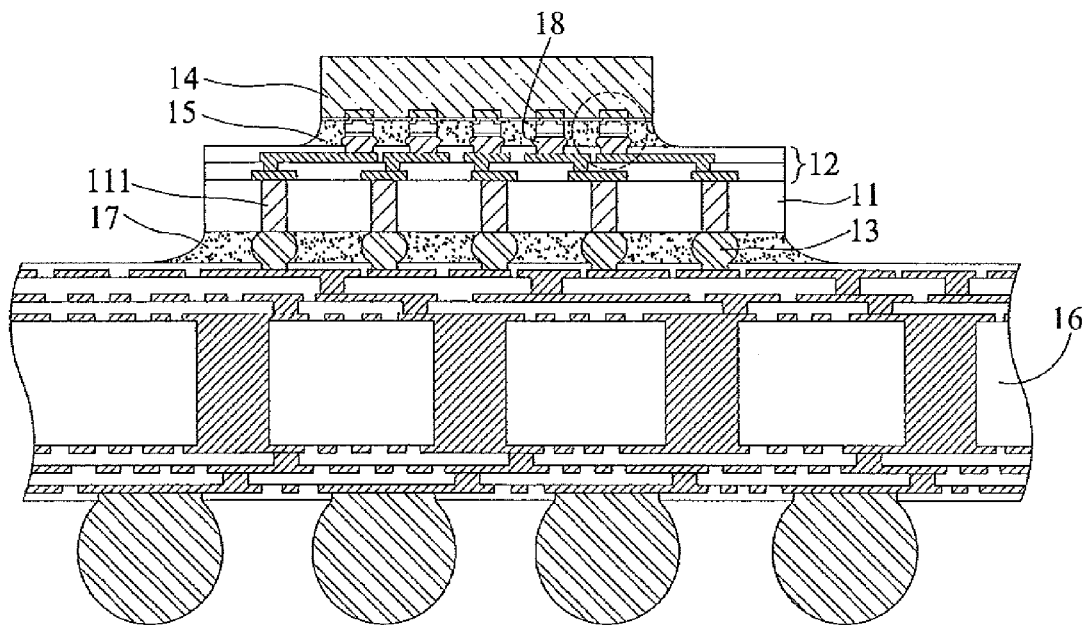
Figure 1B:
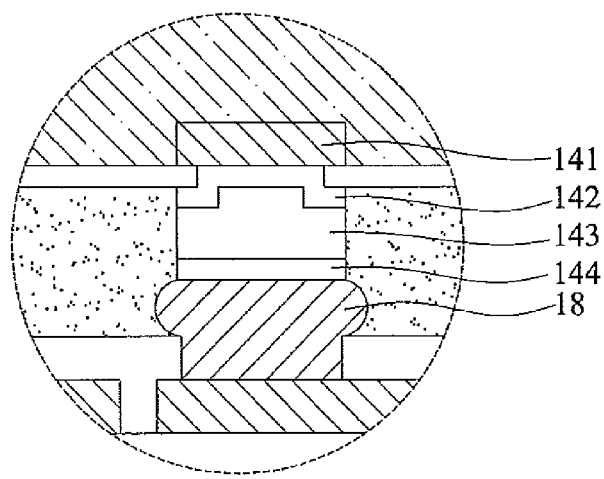
Figure 2A:
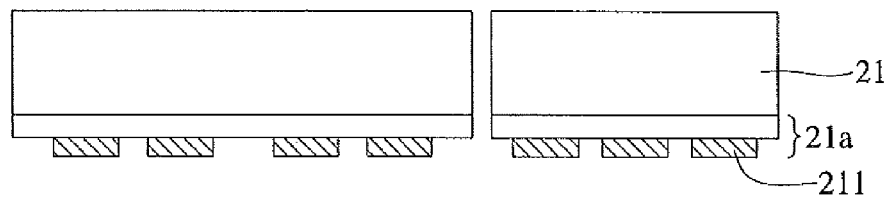
FIGS. 2A to 2H are schematic cross-sectional views showing a semiconductor package and a fabrication method thereof according to the present invention.

Referring to FIG. 2A, at least a semiconductor chip 21 with a plurality of electrode pads 211 on a surface thereof is provided. In the present embodiment, a redistribution layer 21a having the electrode pads 211 is formed on the semiconductor chip 21.

Figure 2B:
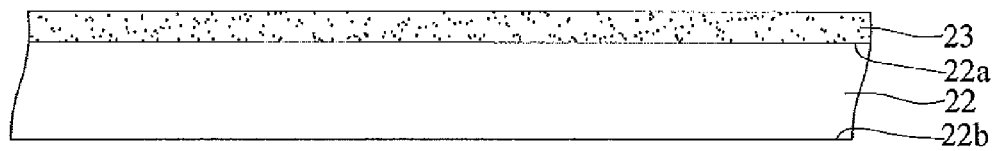

Referring to FIG. 2B, a semiconductor substrate 22 having a first surface 22a with an adhesive layer 23 and a second surface 22b opposite to the first surface 22a is provided.

Figure 2C:
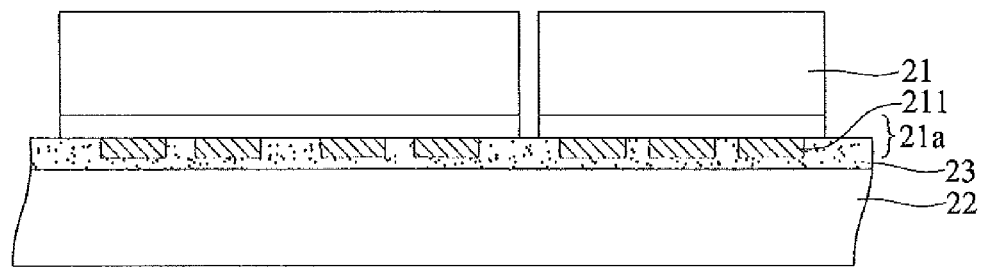

Referring to FIG. 2C, the semiconductor chip 21 is disposed on the adhesive layer 23 through the redistribution layer 21a thereof.

Figure 2D:
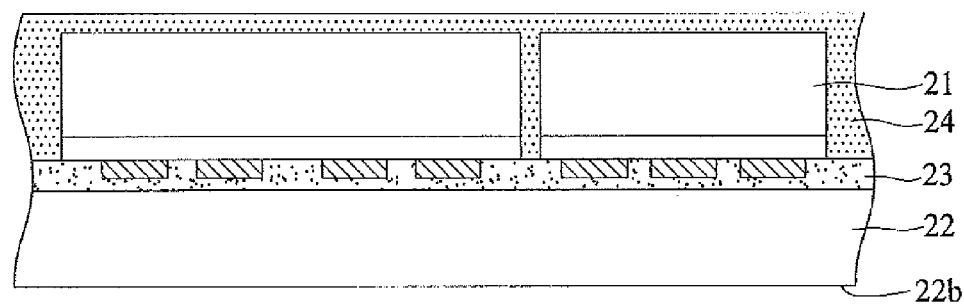

Referring to FIG. 2D, an encapsulant 24 is formed on the adhesive layer 23 for encapsulating the semiconductor chip 21.

Figure 2E:
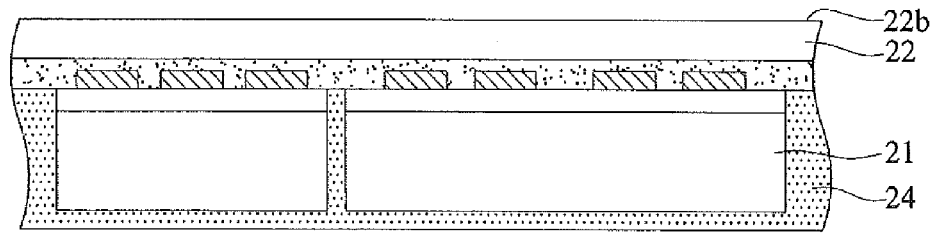

Referring to FIG. 2E, a portion of the semiconductor substrate 22 is removed from the second surface 22b thereof.

Figure 2F:
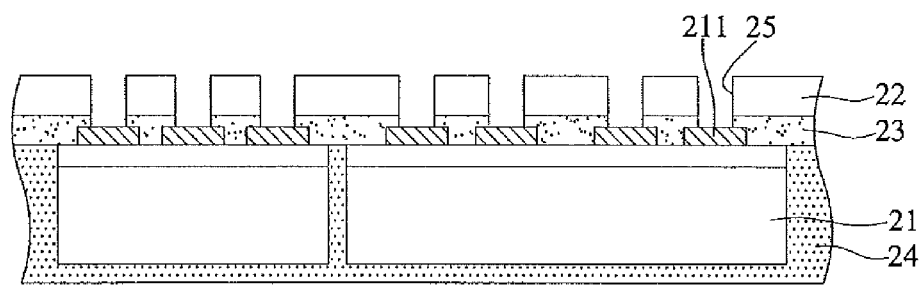

Referring to FIG. 2F, a plurality of through holes 25 are formed by etching to penetrate the semiconductor substrate 22 and the adhesive layer 23 and expose the electrode pads 211.

Figure 2G:
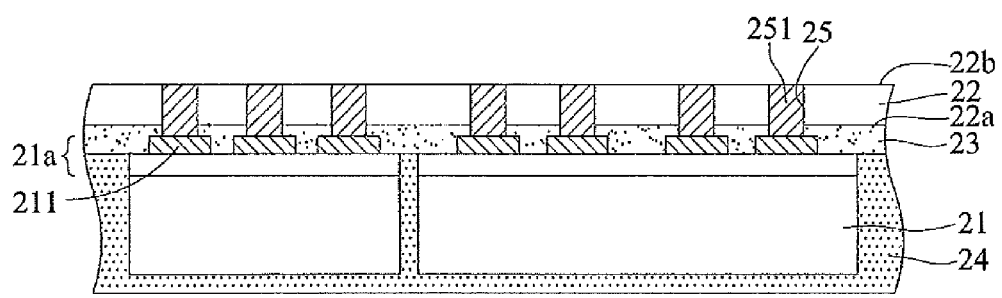

Referring to FIG. 2G by performing an electroplating process, a plurality of conductive posts 251 are formed in the through holes 25 and electrically connected to the semiconductor chip 21. The conductive posts 251 are in direct contact with the semiconductor chip 21.

Figure 2H:
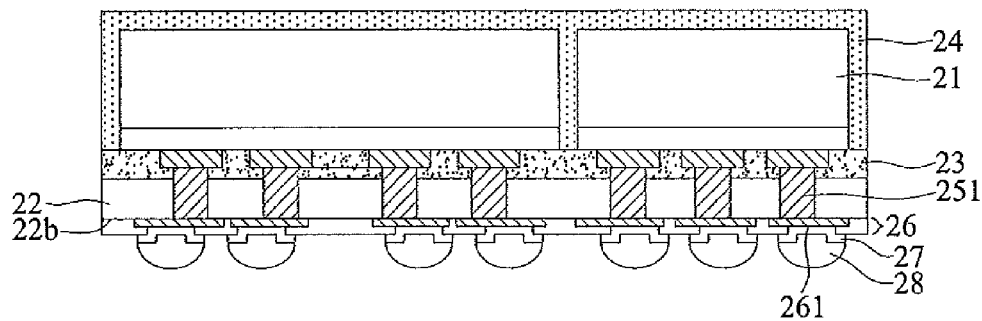

Referring to FIG. 2H, a redistribution layer 26 having a plurality of conductive pads 261 are formed on the second surface 22b of the semiconductor substrate 22. Further, an UBM layer 27 and conductive elements 28 such as solder balls are sequentially formed on the conductive pads 261. Subsequently, a singulation process is performed such that the semiconductor substrate 22, the adhesive layer 23 and the encapsulant 24 are flush with one another at sides.

In another embodiment, the redistribution layer 26 is omitted, and a singulation process is performed after the conductive posts 251 are formed such that the semiconductor substrate 22, the adhesive layer 23 and the encapsulant 24 are flush with one another at sides and a plurality of conductive elements 28 are directly formed on one ends of the conductive posts 251.

The present invention further provides a semiconductor package, which has: a semiconductor substrate 22 having a first surface 22a and a second surface 22b opposite to the first surface 22a; an adhesive layer 23 formed on the first surface 22a of the semiconductor substrate 22; at least a semiconductor chip 21 disposed on the adhesive layer 23; an encapsulant 24 formed on the adhesive layer 23 for encapsulating the semiconductor chip 21; and a plurality of conductive posts 251 penetrating the first surface 22a and the second surface 22b of the semiconductor substrate 22 and the adhesive layer 23 and electrically connected to the semiconductor chip 21.

In the above-described semiconductor package, the semiconductor substrate 22, the adhesive layer 23 and the encapsulant 24 are flush with one another at sides, and a redistribution layer 26 is further formed on the second surface 22b of the semiconductor substrate 22.

The semiconductor chip 21 further has a redistribution layer 21a thereon and electrically connected to the conductive posts 251. Further, a plurality of conductive elements 28 are formed on one ends of the conductive posts 251.

The conductive posts 251 are formed by electroplating and are in direct contact with the semiconductor chip 21.

Therefore, by electrically connecting the semiconductor chip and the semiconductor substrate through the conductive posts instead of the conventional bumps, the present invention reduces the fabrication cost. Further, the present invention reduces the number of joint interfaces between the electrode pads of the semiconductor chip and the conductive posts of the semiconductor substrate, thereby preventing cracking from occurring at joint interfaces and improving the product reliability. Furthermore, the present invention dispenses with an underfilling process by directly attaching the semiconductor chip to the adhesive layer, thereby shortening the fabrication time and improving the product reliability. In addition, the encapsulant is formed to protect the semiconductor chip against external environment and increase the rigidity of the overall structure so as to prevent the structure from being damaged during the fabrication process.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a semiconductor substrate having opposite first and second surfaces;
   an adhesive layer formed on the first surface of the semiconductor substrate;
   at least a semiconductor chip disposed on the adhesive layer;
   an encapsulant formed on the adhesive layer for encapsulating the semiconductor chip; and
   a plurality of conductive posts penetrating the first and second surfaces of the semiconductor substrate and the adhesive layer and electrically connected to the semiconductor chip.

2. The package of claim 1, wherein the semiconductor substrate, the adhesive layer and the encapsulant are flush with one another at sides.

3. The package of claim 1, wherein a redistribution layer is formed on the second surface of the semiconductor substrate.

4. The package of claim 1, further comprising a redistribution layer formed on the semiconductor chip and electrically connected to the conductive posts.

5. The package of claim 1, further comprising a plurality of conductive elements formed on one ends of the conductive posts.

6. The package of claim 1, wherein the conductive posts are formed by electroplating.

7. The package of claim 1, wherein the conductive posts are in direct contact with the semiconductor chip.

8. A fabrication method of a semiconductor package, comprising the steps of:
   providing a semiconductor substrate having a first surface with an adhesive layer and a second surface opposite to the first surface;
   disposing at least a semiconductor chip on the adhesive layer of the first surface of the semiconductor substrate;
   forming an encapsulant on the adhesive layer for encapsulating the semiconductor chip; and
   forming a plurality of conductive posts penetrating the first and second surfaces and the adhesive layer and electrically connected to the semiconductor chip.

9. The method of claim 8, before forming the conductive posts, further comprising removing a portion of the semiconductor substrate from the second surface thereof.

10. The method of claim 8, after forming the conductive posts, further comprising performing a singulation process.

11. The method of claim 8, after forming the conductive posts, further comprising forming a redistribution layer on the second surface of the semiconductor substrate.

12. The method of claim 11, after forming the redistribution layer, further comprising performing a singulation process.

13. The method of claim of 10, wherein the semiconductor substrate, the adhesive layer and the encapsulant are flush with one another at sides.

14. The method of claim 12, wherein the semiconductor substrate, the adhesive layer and the encapsulant are flush with one another at sides.

15. The method of claim 8, wherein the semiconductor chip has a redistribution layer formed thereon and electrically connected to the conductive posts.

16. The method of claim 8, wherein forming the conductive posts further comprises the steps of:
    forming a plurality of through holes penetrating the semiconductor substrate and the adhesive layer; and
    forming the conductive posts in the through holes by electroplating.

17. The method of claim 8, further comprising forming a plurality of conductive elements on one ends of the conductive posts.

18. The method of claim 8, wherein the conductive posts are in direct contact with the semiconductor chip.

* * * * *